United States Patent
Nayfeh et al.

(10) Patent No.: US 7,151,023 B1
(45) Date of Patent: Dec. 19, 2006

(54) METAL GATE MOSFET BY FULL SEMICONDUCTOR METAL ALLOY CONVERSION

(75) Inventors: Hasan M. Nayfeh, Fishkill, NY (US); Mahender Kumar, Fishkill, NY (US); Sunfei Fang, LaGrangeville, NY (US); Jakub T Kedzierski, Nashua, NH (US); Cyril Cabral, Jr., Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,372

(22) Filed: Aug. 1, 2005

(51) Int. Cl.
*H01L 21/8238* (2006.01)
*H01L 21/336* (2006.01)
*H01L 21/8234* (2006.01)
*H01L 21/4763* (2006.01)
*H01L 29/00* (2006.01)

(52) U.S. Cl. .............. 438/231; 438/197; 438/199; 438/585; 438/586; 438/588; 257/510; 257/E21.58

(58) Field of Classification Search ........... 438/231, 438/197, 199, 585–588; 257/510
See application file for complete search history.

(56) References Cited

U.S. PATENT DOCUMENTS

| | | | |
|---|---|---|---|
| 6,512,269 B1* | 1/2003 | Bryant et al. ............... 257/347 |
| 6,562,718 B1 | 5/2003 | Xiang et al. | |
| 6,787,857 B1* | 9/2004 | Kim et al. ................. 257/369 |
| 6,846,734 B1 | 1/2005 | Amos et al. | |
| 7,071,067 B1* | 7/2006 | Ahmad ..................... 438/302 |
| 2004/0094804 A1 | 5/2004 | Amos et al. | |
| 2005/0064636 A1 | 3/2005 | Cabral, Jr. et al. | |
| 2005/0064690 A1 | 3/2005 | Amos et al. | |

OTHER PUBLICATIONS

U.S. Appl. No. 10/786,901, CMOS Silicide Metal Gate Integration Description, Cyril Cabral, Jr., et al., filed Feb. 25, 2004.
U.S. Appl. No. 10/890,753, Formation Of Fully Silicided Metal Gate Using Dual Self-Aligned Siicide Process, Cyril Cabral, Jr., et al., filed Jul. 14, 2004.
U.S. Appl. No. 10/725,851, Method For Integration Of Silicide Contacts And Silicide Gate Metals, Cyril Cabral, Jr., et al., filed Dec. 2, 2003.
U.S. Appl. No. 10/863,830, Selective Implementation Of Barrier Layers To Achieve Threshold Voltage Control In CMOS Device Fabrication With High k Dielectrics, Paruchuri, et al., filed Jun. 4, 2004.
U.S. Appl. No. 10/904,885, Method For Forming Self-Aligned Dual Fully Silicided Gates CMOS Devices, Fang, et al., filed Dec. 2, 2004.

(Continued)

*Primary Examiner*—Michael Lebentritt
*Assistant Examiner*—Mohsen Ahmadi
(74) *Attorney, Agent, or Firm*—Todd M.C. Li

(57) ABSTRACT

A MOSFET structure and method of forming is described. The method includes forming a metal-containing layer that is thick enough to fully convert the semiconductor gate stack to a semiconductor metal alloy in a first MOSFET type region but only thick enough to partially convert the semiconductor gate stack to a semiconductor metal alloy in a second MOSFET type region. In one embodiment, the gate stack in a first MOSFET region is recessed prior to forming the metal-containing layer so that the height of the first MOSFET semiconductor stack is less than the height of the second MOSFET semiconductor stack. In another embodiment, the metal-containing layer is thinned over one MOSFET region relative to the other MOSFET region prior to the conversion process.

14 Claims, 15 Drawing Sheets

OTHER PUBLICATIONS

Advanced Gate Stacks With Fully Silicided (FUSI) Gates And High-k Dielectrics, Enhanced Performance At Reduced Leakage, E.P. Gusev., et al., 2004 IEEE 0-7803-8684-Jan. 2004.

Threshold Voltage Control In NlSi-Gated MOSFETs Through SIIS, Jakub Kedzierski, et al., IEEE T-ED, vol. 52, No. 1, pp. 39-46, Jan. 2005.

Dual Workfunction Fully Silicided Metal Gates, Cyril Cabral, Jr., et al., 2004 Symposium on VLSI Technology, pp. 184-185.

A 90-nm Logic Technology Featuring Strained-Silicon, S.E. Thompson, et al., IEEE T-ED, vol. 51, No. 11, Nov. 2004, pp. 1790-1797.

* cited by examiner

METAL GATE MOSFET BY FULL SEMICONDUCTOR METAL ALLOY CONVERSION

TECHNICAL FIELD

The present invention relates in general to the manufacture of integrated circuits and, more particularly, to a structure and method of making MOSFET devices having metal gates.

BACKGROUND OF THE INVENTION

Metal gate technology allows for improved MOSFET device performance over conventional semiconductor MOSFET devices using semiconductor gate electrodes, due to elimination of the depletion layer in the gate; thus, decreasing the electrical inversion oxide thickness, $t_{inv}$, by about 3–5 Å without incurring a subsequent significant increase in gate oxide leakage current. Typically, semiconductor gate electrodes are formed from polysilicon (poly or poly-Si, amorphous Si, SiGe etc.). MOSFET devices with fully silicided gate electrodes (FUSI gates) allow for thinner electrical inversion oxide thickness, $t_{inv}$ resulting in improved device performance due to increased carrier density in the channel, and also improved control over short-channel effects. Recently, it has been shown that pre-doping of a polysilicon gate electrode along with a high temperature anneal to drive the dopant atoms to the dielectric interface, prior to the silicidation reaction will adjust the workfunction of the resulting metal electrode. As a result, reducing the threshold voltage via compensating channel implant is not required and surface-channel MOSFET operation can be achieved. Specifically, polysilicon gates pre-doped with Antimony (Sb), a well-known n-type dopant, at high doses approaching $4 \times 10^{15}$ cm$^{-3}$ similar to a standard polysilicon gate pre-doping step, then properly annealed at high temperatures, and finally fully silicided using Ni as the starting material, has a workfunction shift compared to an undoped NiSi gate from mid-gap to roughly 120 meV from the conduction band edge. On the other hand, a p-type dopant has yet to be found that can significantly shift the workfunction towards the valence band edge; thus the technique of pre-doping fully silicided gates is less effective for pFET devices. Using current methods, in order to obtain a workfunction that is within 200 meV from the valence band edge, a different metal silicide material, for example, using a NiPt alloy with a 30% Pt concentration, may be required. The use of different processes for silicidation of the nFET and pFET gate conductors makes integration of both nFET and pFET devices difficult, especially in tightly packed memory cells. Hereinafter, for convenience, the use of the term silicidation is meant to include any process of forming a semiconductor metal alloy, the term silicide is meant to include any such resulting semiconductor metal alloy and the term silicided is meant to include any appropriate semiconductor that has been converted to a semiconductor metal alloy, and is not meant to be limited to processes or materials involving only silicon semiconductors.

Accordingly, it would be desirable to provide a structure and method for cost effective integration of fully silicided (FUSI) MOSFET devices in dense layouts that takes advantage of improved performance of FUSI gates without a significant adverse impact on the electrical properties of the MOSFETs.

SUMMARY OF THE INVENTION

It is an objective of the present invention to provide a structure and a method for making the structure that leverages improved performance of metal gates achieved via full silicidation (FUSI) of a semiconductor gate without disrupting the electrical properties of the transistor.

It is a further objective of the present invention to provide a cost effective method for integration of one of a fully silicided nFET or pFET, while not adversely impacting the electrical properties of the other one of the nFET and pFET.

It is yet a further objective of the present invention to provide a structure and cost effective method of making and integrating the structure including a fully silicided FET of a first type (for example, an nFET or pFET) with a partially silicided FET of a second type. For example, if the nFET has a fully silicided gate, the pFET is formed with a partially silicided gate, or vice versa as desired.

It is a further objective of the present invention to provide fully silicided (FUSI) nFET devices and a method for making and integrating the FUSI nFET devices with pFET devices having partially silicided gate electrodes, such that both nFET and pFET devices have threshold voltages similar to a standard gate electrode.

It is yet a further objective of the present invention to provide FUSI nFET and pFET devices that can be integrated in densely packed circuits with spacing between nFET and pFET devices less than about 200 nm.

According to one aspect of the present invention, a method is provided of forming a semiconductor structure comprising: providing a structure comprising a gate stack in an nFET region and a gate stack in a pFET region, where the gate stacks each comprise a semiconductor layer, and the structure further comprises a planarized dielectric layer formed over the gate stacks in the nFET and pFET regions; removing portions of the planarized dielectric layer to expose the semiconductor layers of the gate stacks; forming a metal-containing layer in contact with the exposed semiconductor layers of the gate stacks, wherein the metal-containing layer is thick enough to fully silicide the semiconductor layer of the gate stack in a first one of the nFET region and pFET region but not thick enough to fully silicide the semiconductor layer in a second of the nFET and pFET region; and forming a fully silicided gate conductor from the metal-containing layer in contact with the semiconductor layer of the gate stack in the first one of the nFET region and pFET region while forming a partially silicided gate conductor from the metal-containing layer in contact with the semiconductor layer of the gate stack in the second one of the nFET region and pFET region.

In one embodiment of the present invention, prior to forming the metal-containing layer, the semiconductor layer of the gate stack in the first one of the nFET region and the pFET region is recessed to a height that is less than the height of the semiconductor layer of the gate stack in the second one of the nFET and pFET region. Preferably, the recessing of the semiconductor layer of the gate stack in the first one of the nFET region and the pFET region comprises an anisotropic etch, such as RIE, of the semiconductor layer selective to the planarized dielectric layer.

According to another embodiment of the present invention, the metal-containing layer is thinned over the second one of the nFET and the pFET region relative to the thickness of the metal-containing layer over the first one of the nFET region and the pFET region. The thinning of the metal containing layer is preferably performed using a wet etch.

According to yet another aspect of the invention, a semiconductor structure is described comprising: a first one of an nFET device and a pFET device comprising a partially-silicided gate conductor including a lower gate conductor portion comprising a semiconductor layer and an upper silicide gate conductor portion atop said lower gate conductor portion; and a second one of an nFET device and a pFET device comprising a fully-silicided gate conductor having a height less than the height of said partially-silicided gate conductor of said first one of said nFET device and pFET device. In a preferred embodiment, the semiconductor structure of the invention includes a pFET device and an nFET device that are spaced apart at a distance less than 200 nm.

According to yet another aspect of the invention, a semiconductor structure comprising an nFET device comprising a fully-silicided gate conductor and a pFET device comprising a partially-silicided gate conductor is formed by a method comprising: providing a structure comprising a gate stack in an nFET region and a gate stack in a pFET region, where the gate stacks each comprise a semiconductor layer, and the structure further comprises a planarized dielectric layer formed over the gate stacks in the nFET and pFET regions; removing portions of the planarized dielectric layer to expose said semiconductor layers of said gate stacks; forming a metal-containing layer in contact with the exposed semiconductor layers of the gate stacks, wherein the metal-containing layer is thick enough to fully silicide the semiconductor layer of the gate stack in the nFET region but not thick enough to fully silicide the semiconductor layer in the pFET region; and forming a fully silicided gate conductor from the metal-containing layer in contact with the semiconductor layer of the gate stack in the nFET region while forming a partially silicided gate conductor from the metal-containing layer in contact with the semiconductor layer of the gate stack in the pFET region.

BRIEF DESCRIPTION OF THE DRAWINGS

These and other features, aspects, and advantages will be more readily apparent and better understood from the following detailed description of the invention, with reference to the following figures wherein like designations denote like elements, which are not necessarily drawn to scale.

DETAILED DESCRIPTION

Figure 1:
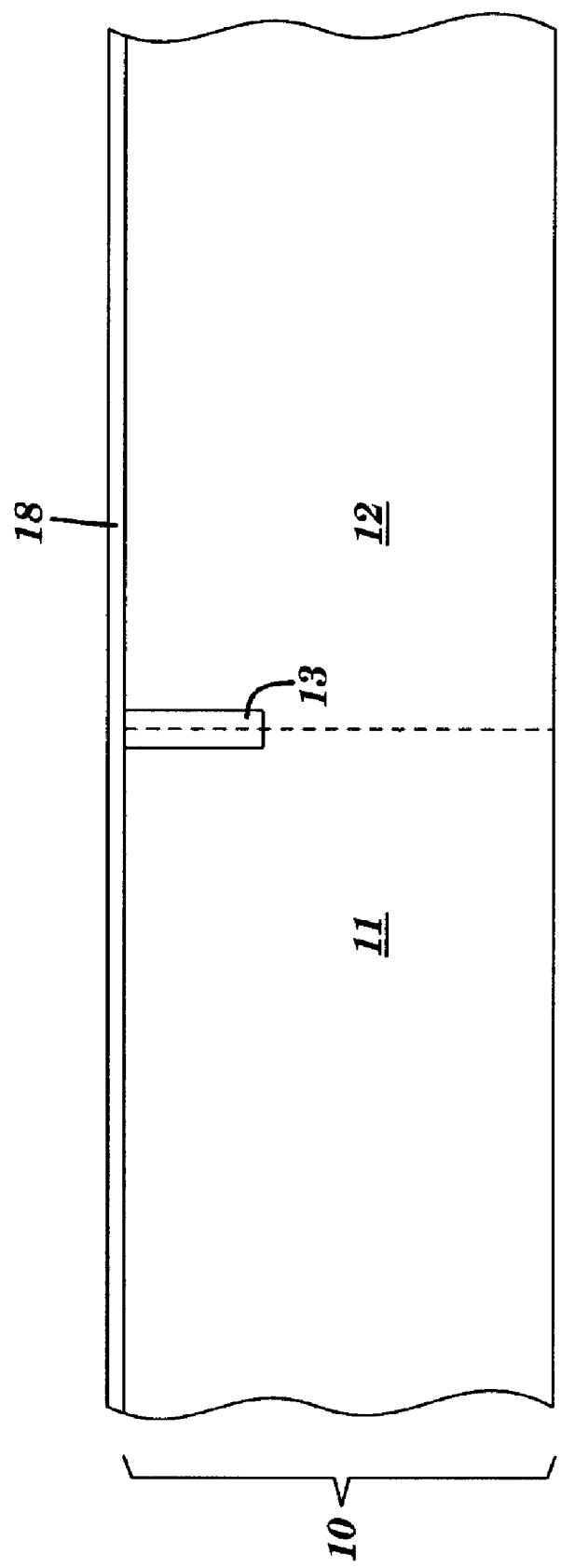
FIGS. 1 through 10 illustrate process steps used to form one embodiment of the invention.

The present invention, which provides structures and methods for integrating MOSFET devices of a first type (e.g. nFET) having fully silicided gate electrodes with MOSFET devices of a second type (e.g. pFET) having partially silicided gate electrodes, will now be described in more detail by referring to the drawings that accompany the present application. In accordance with the present invention, a process flow is provided whereby the MOSFET devices of the first type include fully silicided gate electrodes, and the MOSFET devices of the second type have partially silicided electrodes such that both devices have threshold voltages similar to a standard polysilicon gate electrode approach. The technique described in this disclosure can be applied to densely packed circuits with gate pitch less than about 200 nm. In the exemplary embodiments described hereinafter, nFETs are implemented with fully silicided gate electrodes while the pFETs are implemented with partially silicided gate electrodes, but the present invention is not intended to be limited to those embodiments, but is similarly applicable to fully silicided pFET gate electrodes integrated with partially silicided nFET gate electrodes. The structure described is applicable to dense circuits, with gate pitch on the order of 200 nm, consistent with the 65 nm technology node, and is extendable to future technology generations.

Reference is made to FIG. 1 which illustrates an initial semiconductor wafer substrate 10, which can include, but is not limited to, a bulk silicon-containing substrate, a silicon-on-insulator (SOI) wafer. The silicon or silicon-containing substrate can include semiconductor materials such as, but not limited to: Si, SiGe, SiC, and SiGeC, that can be employed in the present invention. Specifically, the initial wafer 10 of FIG. 1 comprises an n-doped well region 11 and a p-doped well region 12. A gate dielectric layer 18 is formed atop the substrate 10, and an isolation region 13 may be formed in the substrate 10. The isolation region 13 may be formed using by any method currently known or developed in the future, including conventional lithography and etching processes to form trenches which are subsequently filled with a dielectric such as TEOS (tetraethylorthosilicate) or oxide using a process such as chemical vapor deposition (CVD) or plasma CVD, followed by planarization, such as chemical-mechanical polishing (CMP). A gate dielectric layer 18 is formed atop the substrate, utilizing a conventional thermal growing process or by deposition. The gate dielectric 18 is typically a thin layer having a thickness of from about 1 to about 10 nm. The gate dielectric may be composed of an oxide including, but not limited to: $SiO_2$, oxynitides, $Al_2O_3$, $ZrO_2$, $HfO_2$, $Ta_2O_3$, $TiO_2$, perovskite-type oxides, silicates and combinations of the above with or without the addition of nitrogen. The gate dielectric may be formed using a thermal growing process or by deposition.

Figure 2:
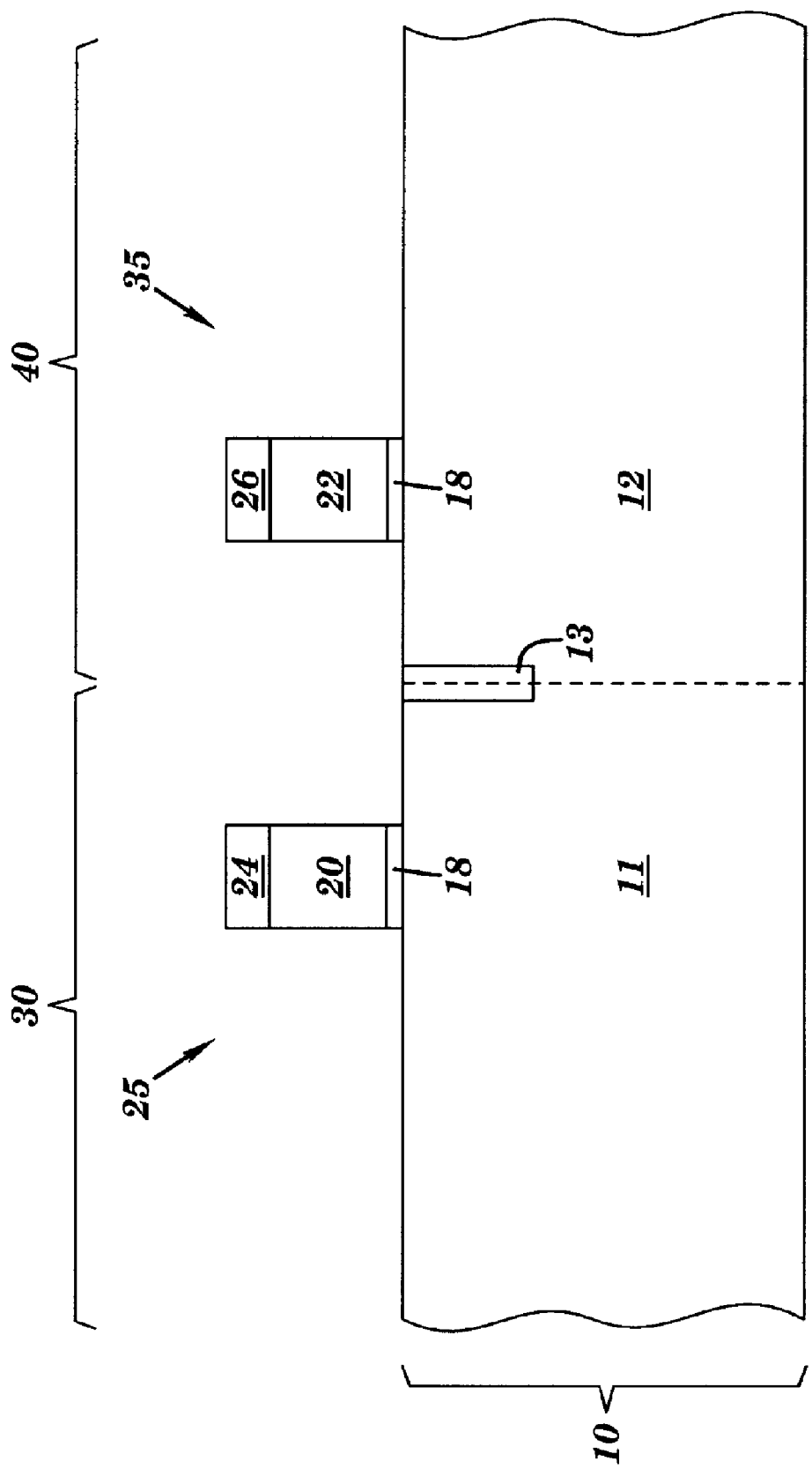

After forming the gate dielectric on the exposed surface of the structure, gate stacks 25 and 35 are formed over the n-doped well region 11 and p-doped well region 12, respectively, as illustrated in FIG. 2. The p-FET device region 30 comprises the gate stack 25 formed on the n-doped region, and the n-FET device region 40 comprises the gate stack 35 formed on the p-doped region 12.

The gate stacks 25, 35 may comprise one or more semiconductor layers 20, 22, including, but not limited to semiconductor materials such as polysilicon, Ge, SiGe, SiC, SiGeC, or the like, which may include a semiconductor that is doped, for example, with a p+ type dopant in the pFET region 30 and with an n+ type dopant in the nFET region 40. The gate stacks 25, 35 may include a hardmask layer 24, 26, typically comprising a nitride such as silicon nitride. The gate stacks 25, 35 may be formed by depositing semiconductor layers and hardmask layers and utilizing patterning methods such as conventional lithography and etching so as to provide a plurality of patterned stack regions atop the wafer 10.

Figure 3:
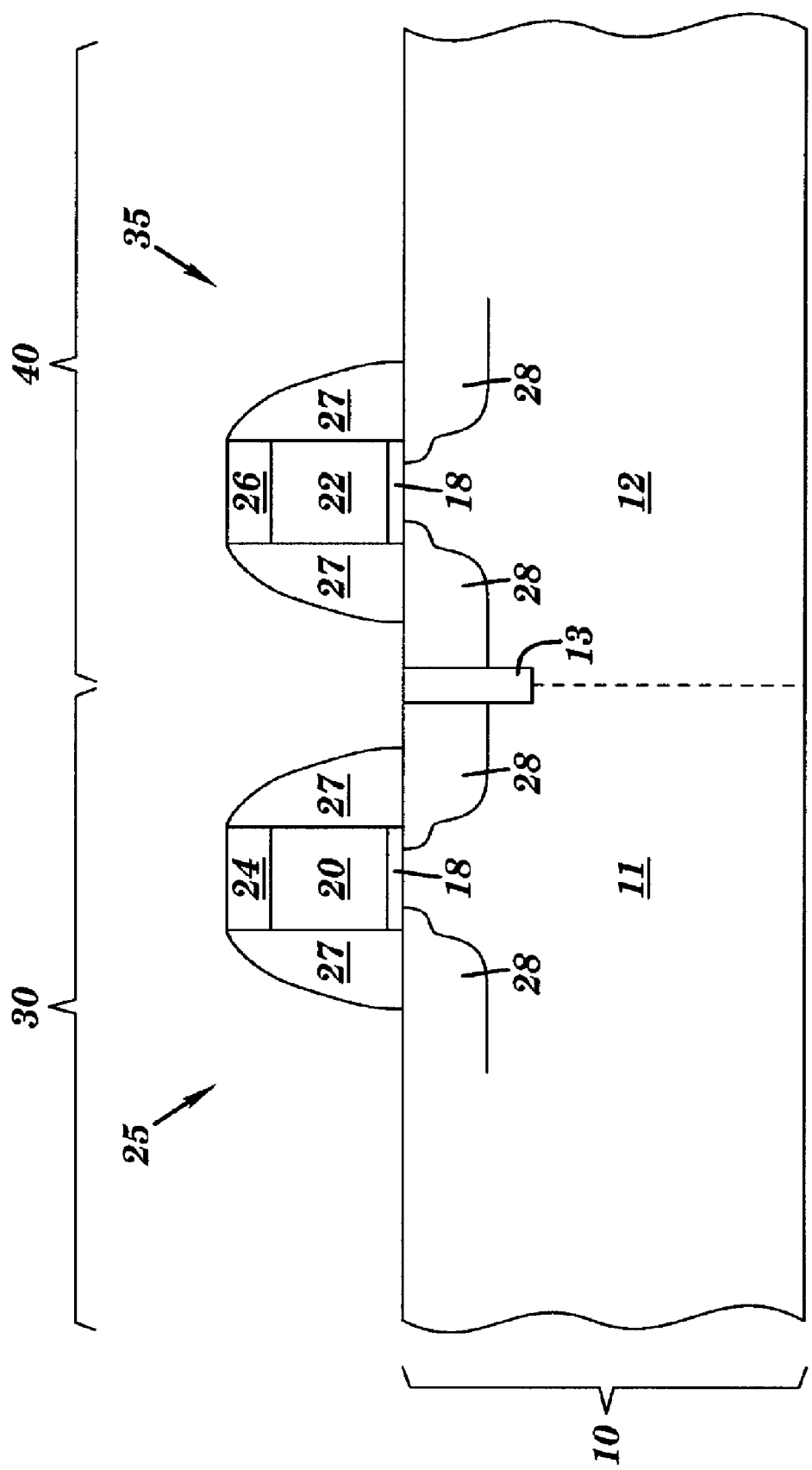

Referring to FIG. 3 source/drain areas shown in regions 28, 29 are formed into doped regions 11, 12 by utilizing conventional ion implantation, such as n+ type dopants in the source/drain regions 28 in the n-type well 11 of the pFET region 30, and p+ type dopants in the source/drain regions 29 in the p-type well 12 of the nFET region 40. This is followed by annealing, for example at temperatures in the range from about 1000 to 1100° C. to activate the source/drain regions 28, 29. Insulating spacers 27 are then formed on each exposed vertical sidewall surface of the patterned stack regions 25, 35 by first depositing an insulating material, such as a nitride or oxynitride, and then selectively etching the insulator material. The spacer 27 may comprise multiple spacers and materials, for example, spacers 27 may include an inner spacer comprising a nitride and an outer spacer comprising an oxide. FIG. 3 shows the structure after the above processing steps have been performed.

Figure 4:
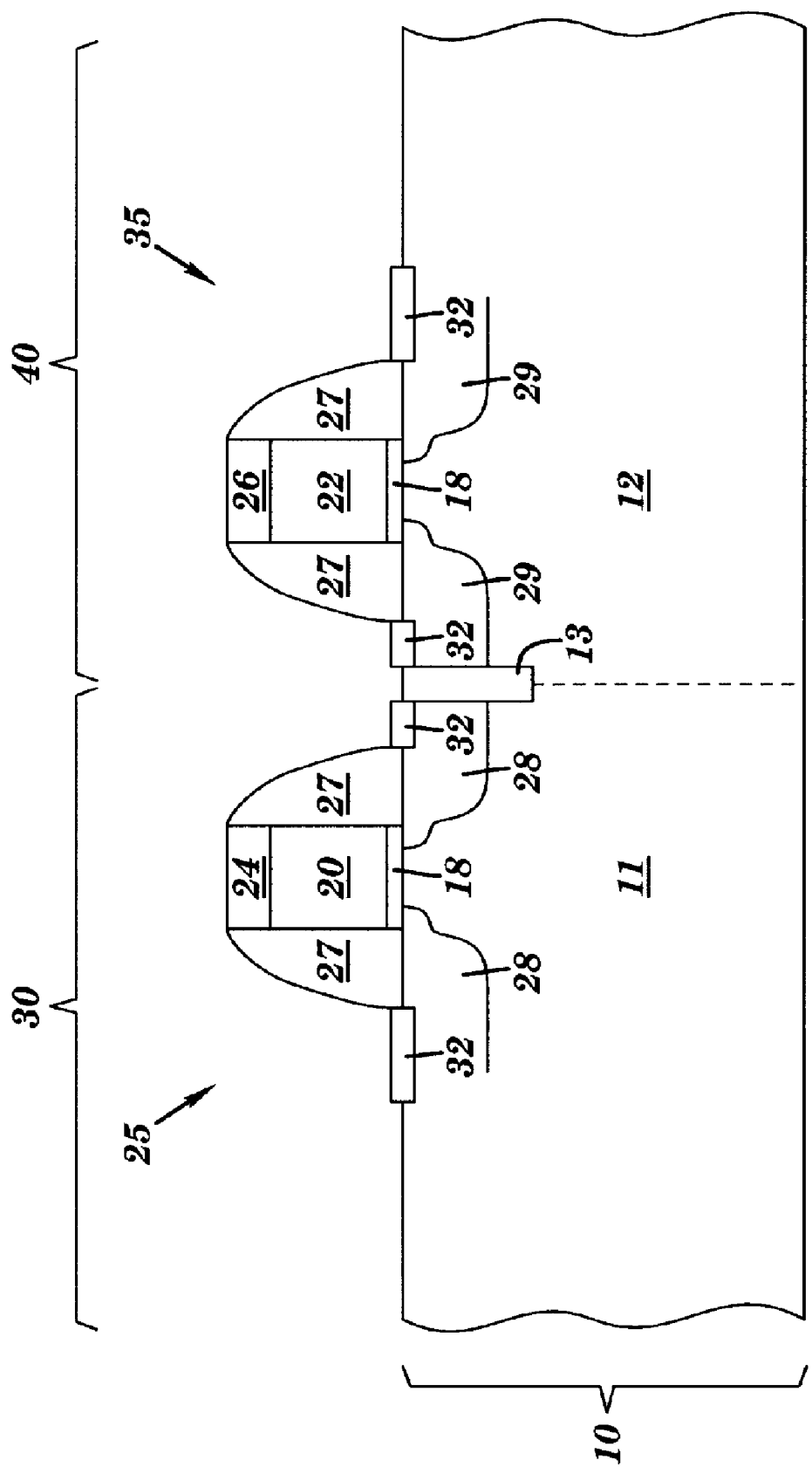

Referring now to FIG. 4, suicide regions 32 on the source/drain areas 28, 29 are formed. In a preferred embodiment, a self-aligned salicide process is used to form the suicide regions 32. In a preferred embodiment, a metal such as nickel is deposited, for example by a suitable method such as sputtering, PECVD, electron beam evaporation, or the like. Any metal may be used that is capable of forming a metal silicide when in contact with silicon and subjected to annealing. Suitable metals include, but are not limited to: Co, Ni, Ti, W, Mo, Ta and the like. Preferred metals include Ni, Co and Ti, with nickel most preferred. This is followed by a rapid thermal anneal (RTA) at temperatures depending on the metal, for example, if the metal is Ni, the temperature is preferably in the range of 300–600° C. to form nickel silicide regions 32. Subsequently, any unreacted metal is removed, resulting in the structure illustrated in FIG. 4.

Figure 5:
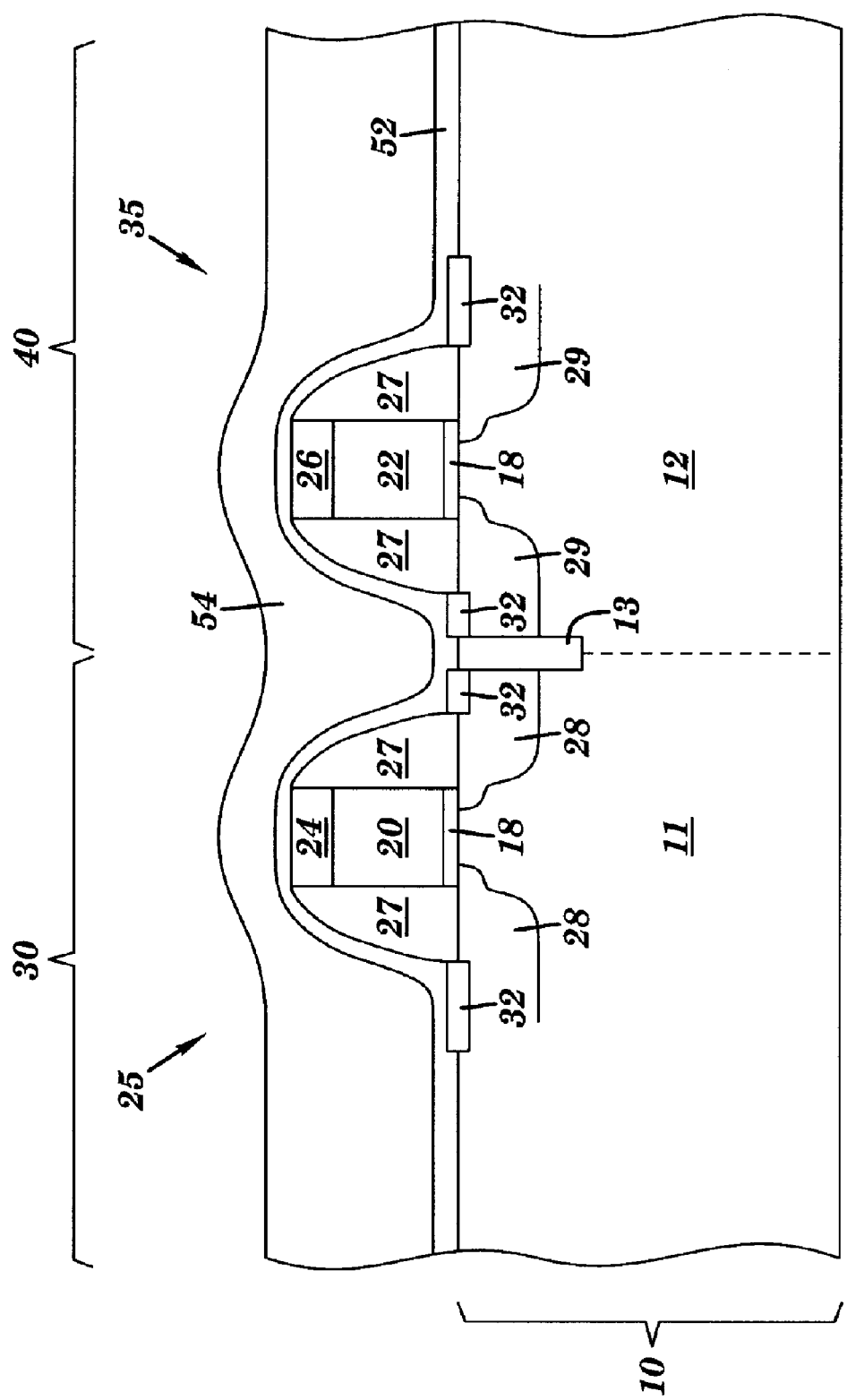

Next, referring to FIG. 5, a thin dielectric layer 52 is formed over the structure covering the nFET region 40 and pFET region 30 including the silicide regions 32. The thin dielectric layer 52 will act to protect the silicide regions 32 during a subsequent reactive ion etch (RIE) process. Preferably the thin dielectric layer 52 is a nitride, having a thickness of about 10–30 nm. Subsequently, a second dielectric layer 54 is formed atop the thin dielectric layer 52. In a preferred embodiment, the thick dielectric layer 54 is an oxide. The thick dielectric layer 54 is thicker than the height of the gate stacks 25, 35, preferably about 1.5 to 3 times thicker than the height of the gate stacks, and more preferably about 2 to 3 times the height of the gate stacks 25, 35. The resulting structure is illustrated in FIG. 5.

Figure 6:
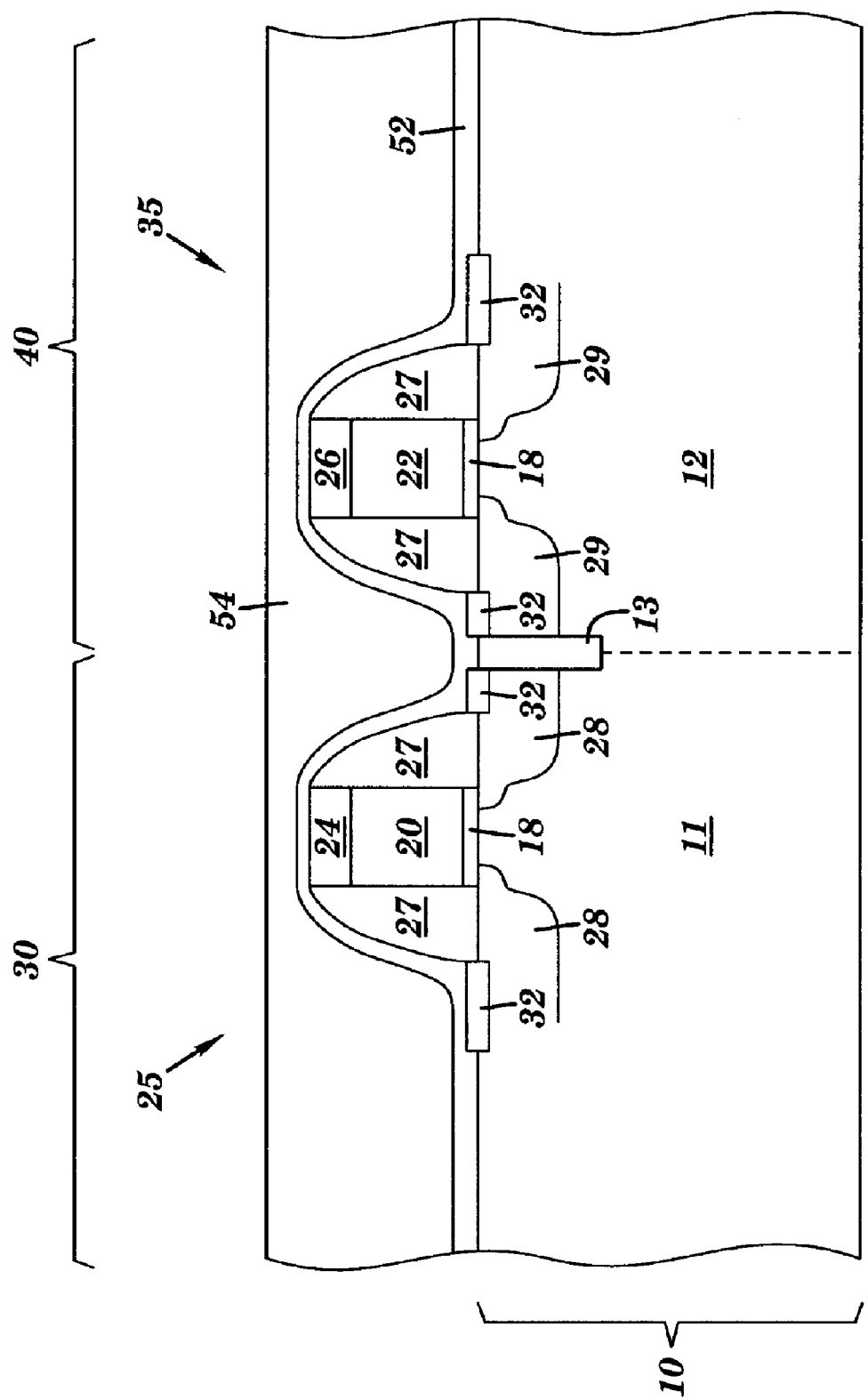
Figure 7:
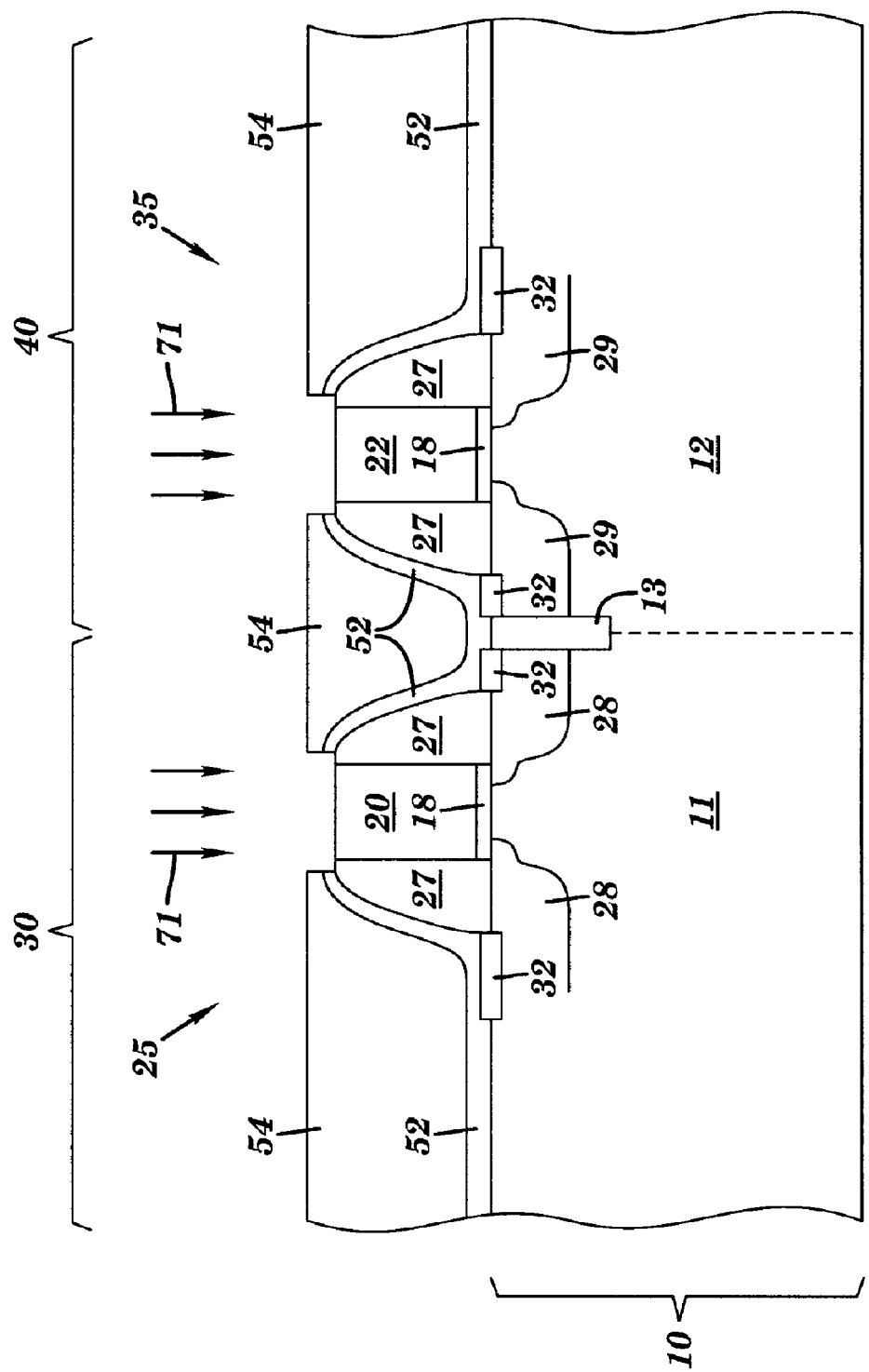

The wafer is then planarized, for example, by chemically-mechanically polished (CMP), as shown in FIG. 6, so that the thick dielectric layer 54 is planarized and still covers the gate stacks 25, 35. The thick dielectric layer 54 (typically oxide), the thin dielectric layer 52 (typically nitride), the hardmask 24 (typically nitride), and the spacers 27 (typically a combination of oxide and nitride) are then anisotropically etched, for example using RIE 71, to expose the semiconductor gate electrodes 20, 22 (typically polysilicon). There may be some topology since typically the etch rates for oxide and nitride are different, as long as the etch process stops on the polysilicon. The resulting structure is illustrated in FIG. 7.

Figure 8:
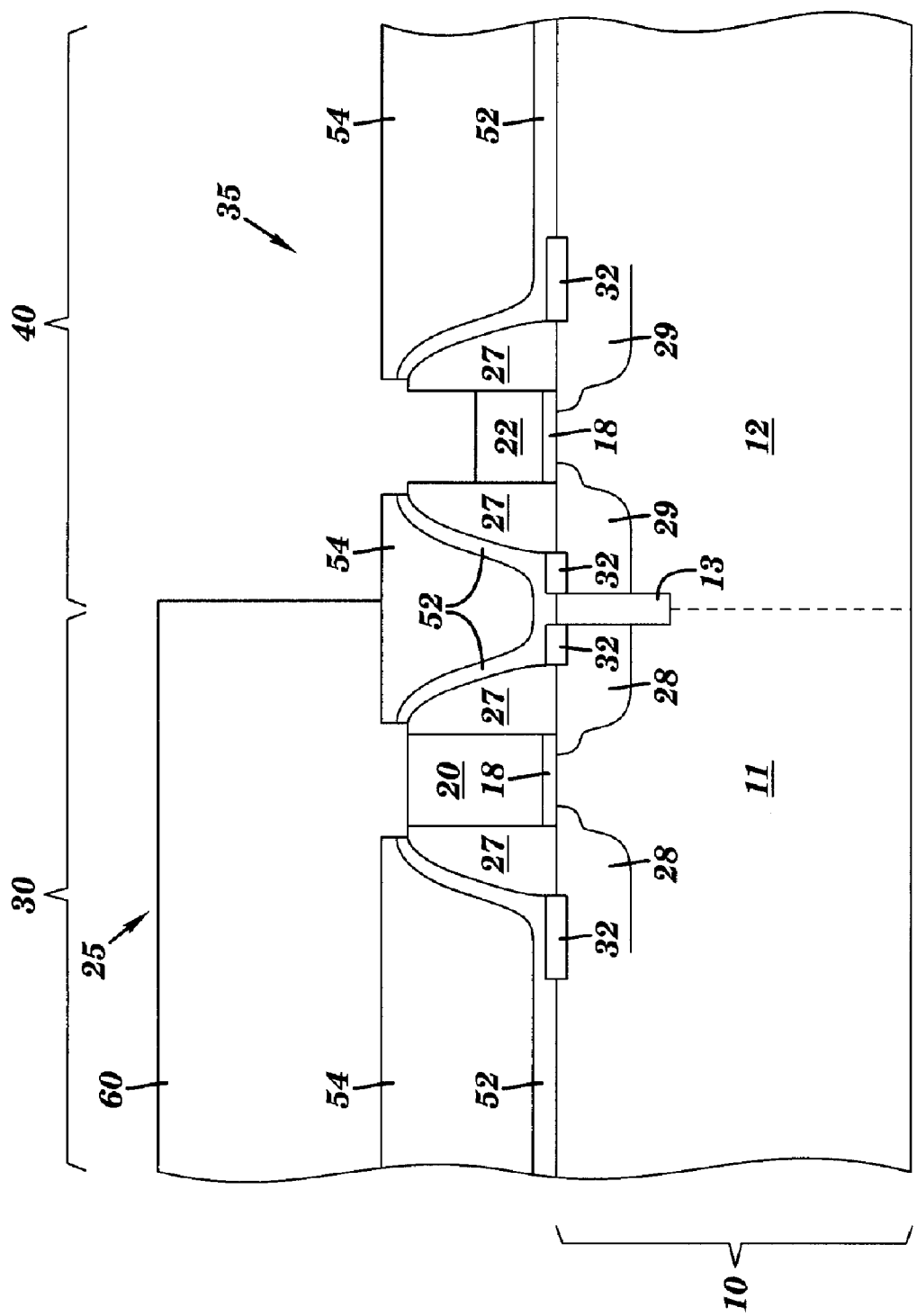

Referring to FIG. 8, next, the pFET area 30 is blocked with photo-resist layer 60 using an existing lithography reticle in the technology. Note that the present invention doesn't require the introduction of a new reticle into this step of the process. Then the nFET semiconductor gate 22 (typically polysilicon) is thinned down using a dry anistropic etch, e.g. RIE, selective to the dielectric layers 54, 52 and spacers 27 (typically selective to nitride and oxide). The nFET semicondutor gate electrode 22 is preferably thinned to from about one half to about one third the initial thickness. The resulting nFET gate electrode is preferably sufficiently thin to enable full silicidation of the nFET gate electrode 22, but not the pFET gate electrode 20. The RIE is preferably performed so that the resulting structure is not attacked laterally, which is an important consideration for densely packed gate lines (<200 nm pitch).

Figure 9:
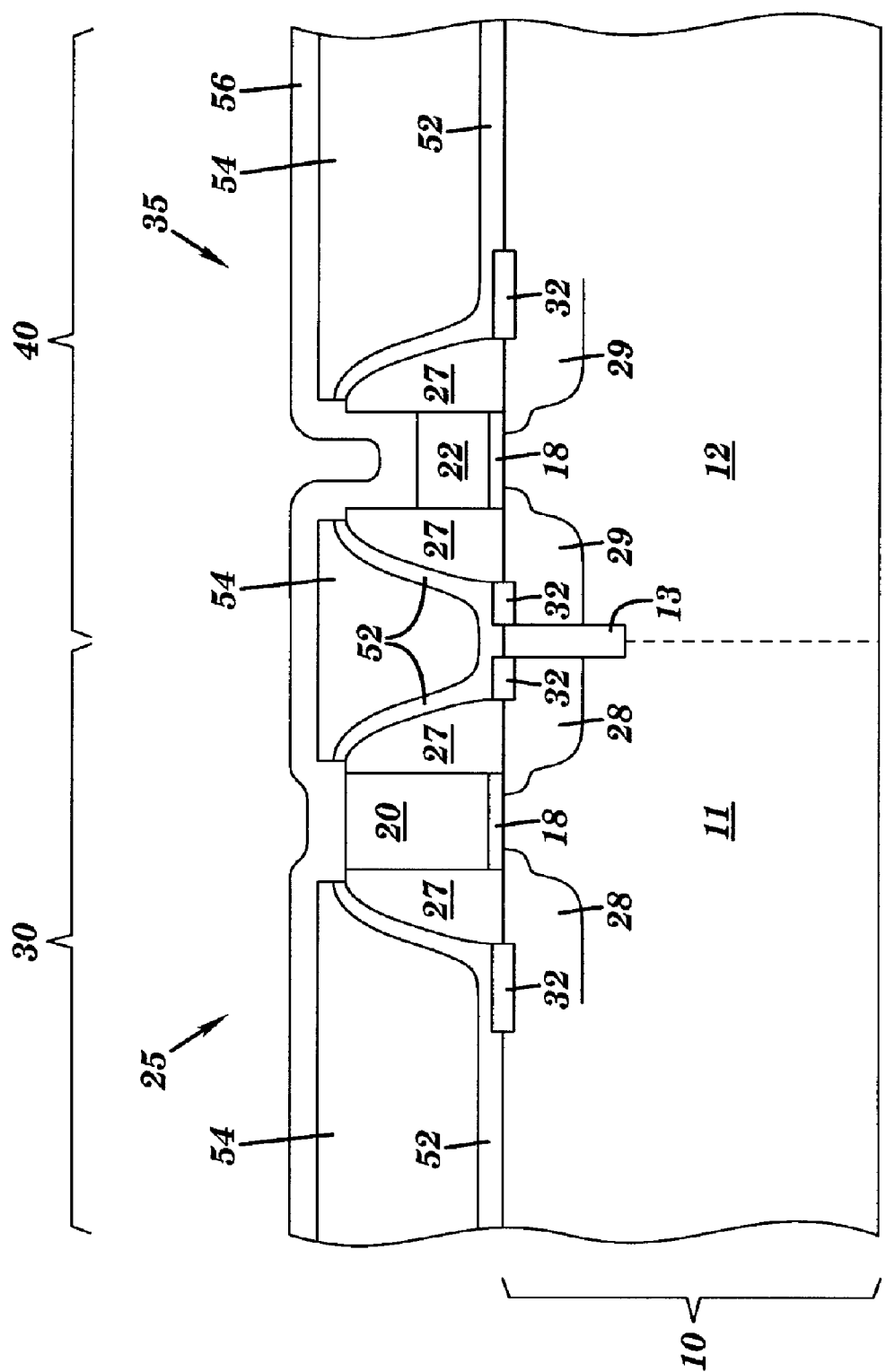

Referring to FIG. 9, the photo-resist is then removed, for example by wet etch, and next, a metal-containing layer 56 is deposited to contact the exposed surface of the semiconductor gate electrodes 20, 22, which will subsequently be reacted with the gate electrodes 20, 22. Preferably, the metal-containing layer 56 is substantially uniform in composition across both the nFET 30 and pFET 40 regions. The metal-containing layer 56 may include any metal that is capable of forming a semiconductor metal alloy when in contact with the semiconductor, which reaction is typically referred to as silicidation when the semiconductor material is silicon. Hereinafter, the term "silicidation" is used to refer to the process of forming a semiconductor metal alloy from the reaction of a semiconductor material, including, but not limited to Si, Ge, SiGe, SiC, SiGeC, GaAs and the like, with a metal, including, but not limited to Co, Ni, Ti, W, Mo, Ta and the like. Preferably, the metal is selected so that resulting semiconductor metal alloy (hereinafter, for convenience, referred to as a "silicide") has a work function that is similar to that of a heavily doped semiconductor, such as heavily doped polysilicon. For polysilicon gate electrodes, preferred metals include Ni, Co and Ti, with nickel most preferred. The metal layer 56 is deposited at a thickness that is thick enough to fully silicide the remaining nFET gate electrode 22, but not fully silicide the pFET gate electrode 20.

Figure 10:
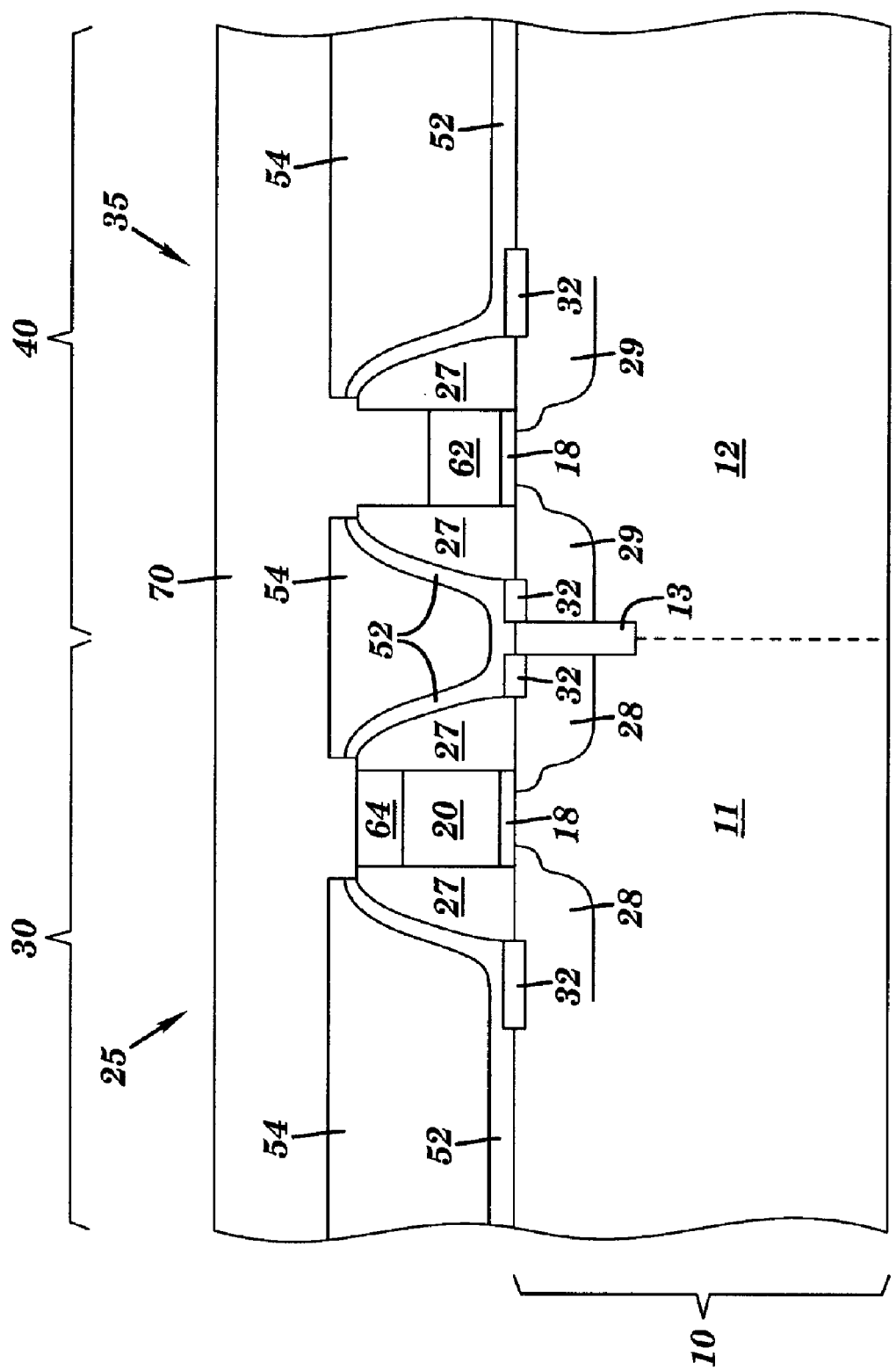

Next the structure is subjected to a rapid thermal anneal (RTA) to react the metal layer 56 with gate electrodes 20, 22. The RTA is performed at temperatures depending on the semiconductor material and the metal. For polysilicon gate electrodes with nickel, a temperature ranging from 300–600° C. is preferred, while for Co, the preferred temperature ranges from 550–750° C. In this embodiment, since the pFET polysilicon 20 is thicker than the nFET polysilicon 22, the resulting salicide process partially consumes the pFET electrode 20, while the nFET electrode 22 is fully consumed, forming a fully-silicided nFET gate electrode 62 as shown in FIG. 10. The pFET gate stack is partially silicided, including a silicide portion 64 and unreacted portion 20. An interlevel dielectric (ILD) layer 70 is typically formed over the structure, having a thickness ranging from about 400 to 500 nm, and the nFET and pFET devices are completed as normal.

Figure 11:
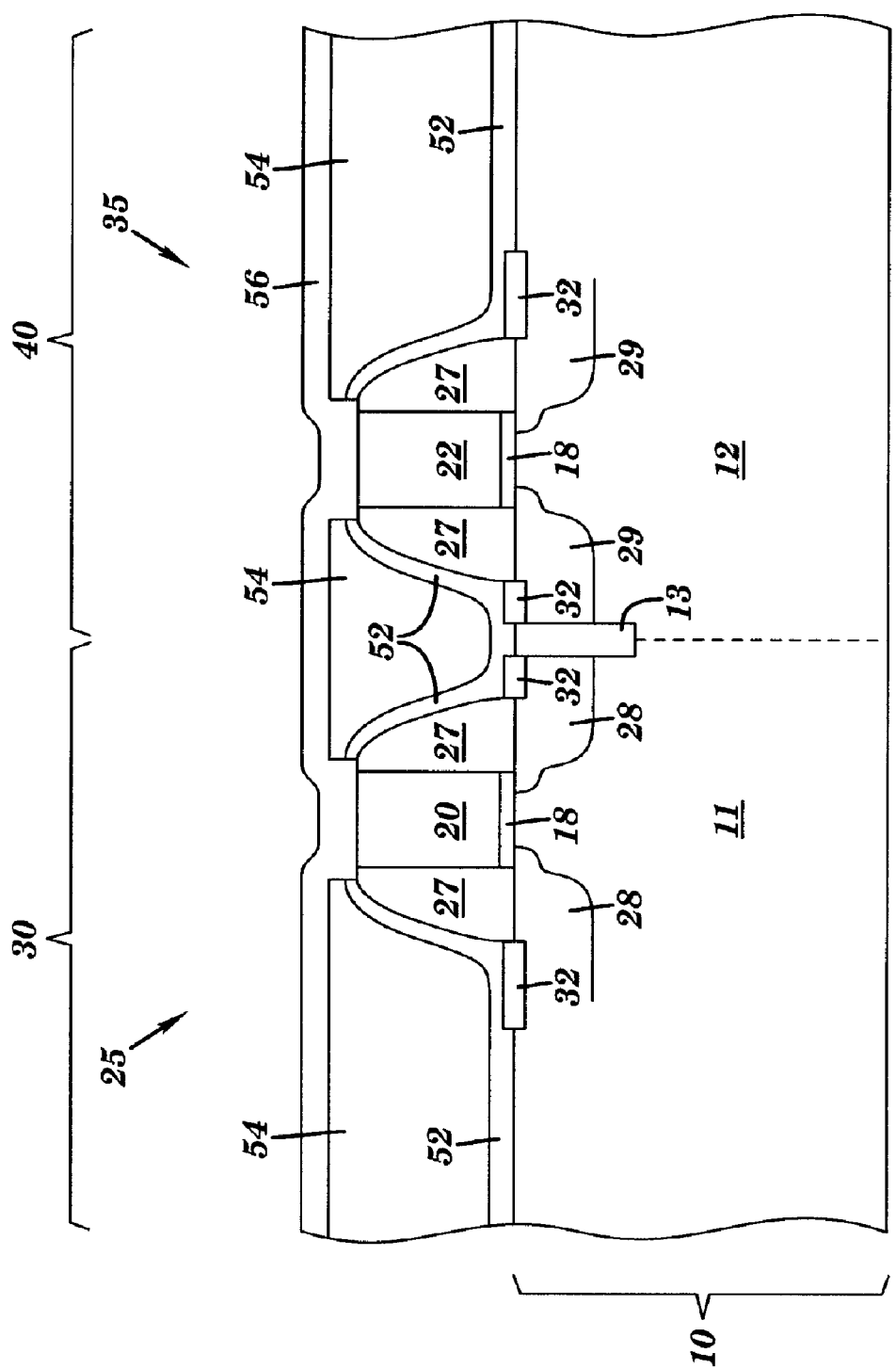
FIGS. 11 through 15 illustrate process steps used to form a second embodiment of the present invention.
Figure 12:
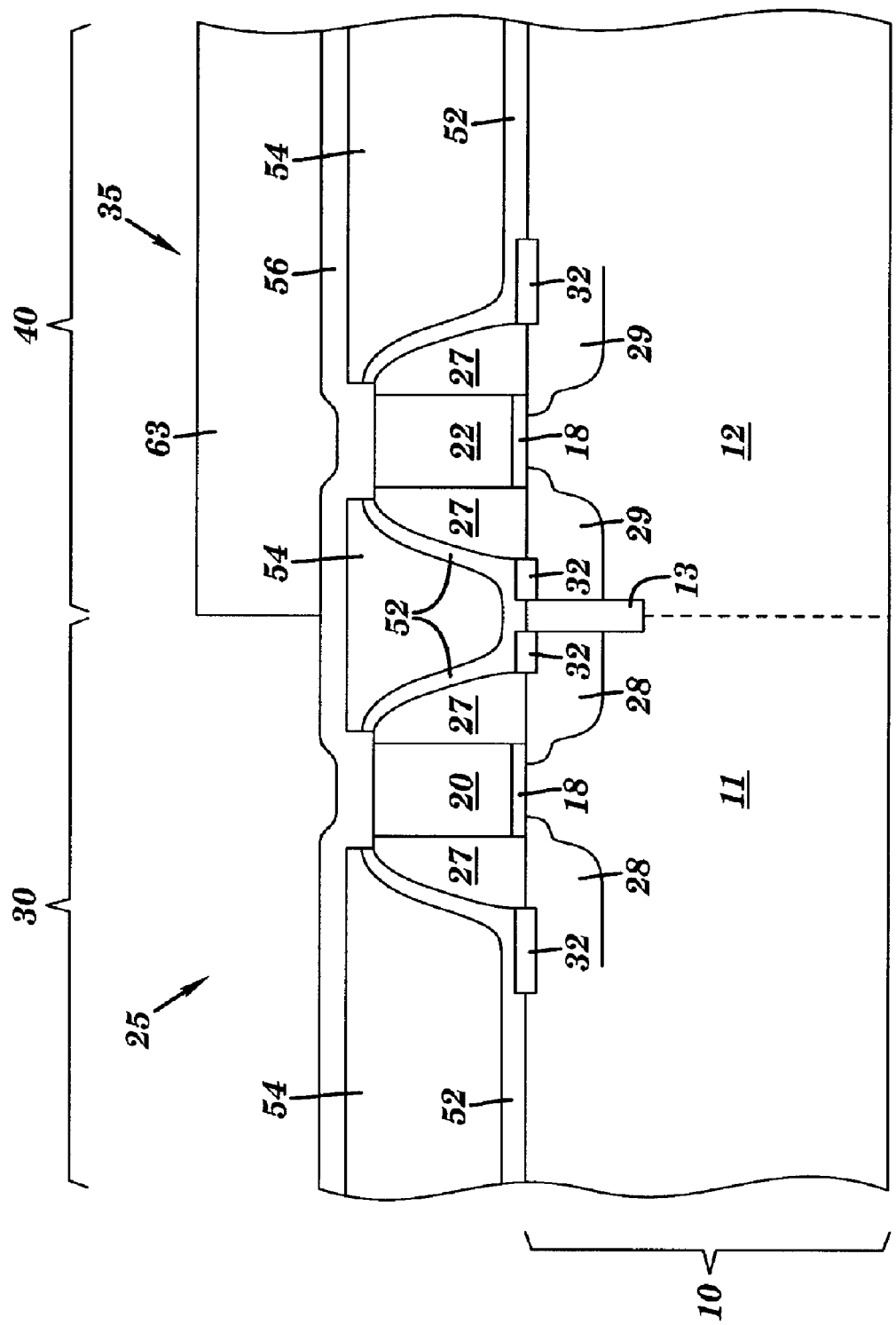
Figure 13:
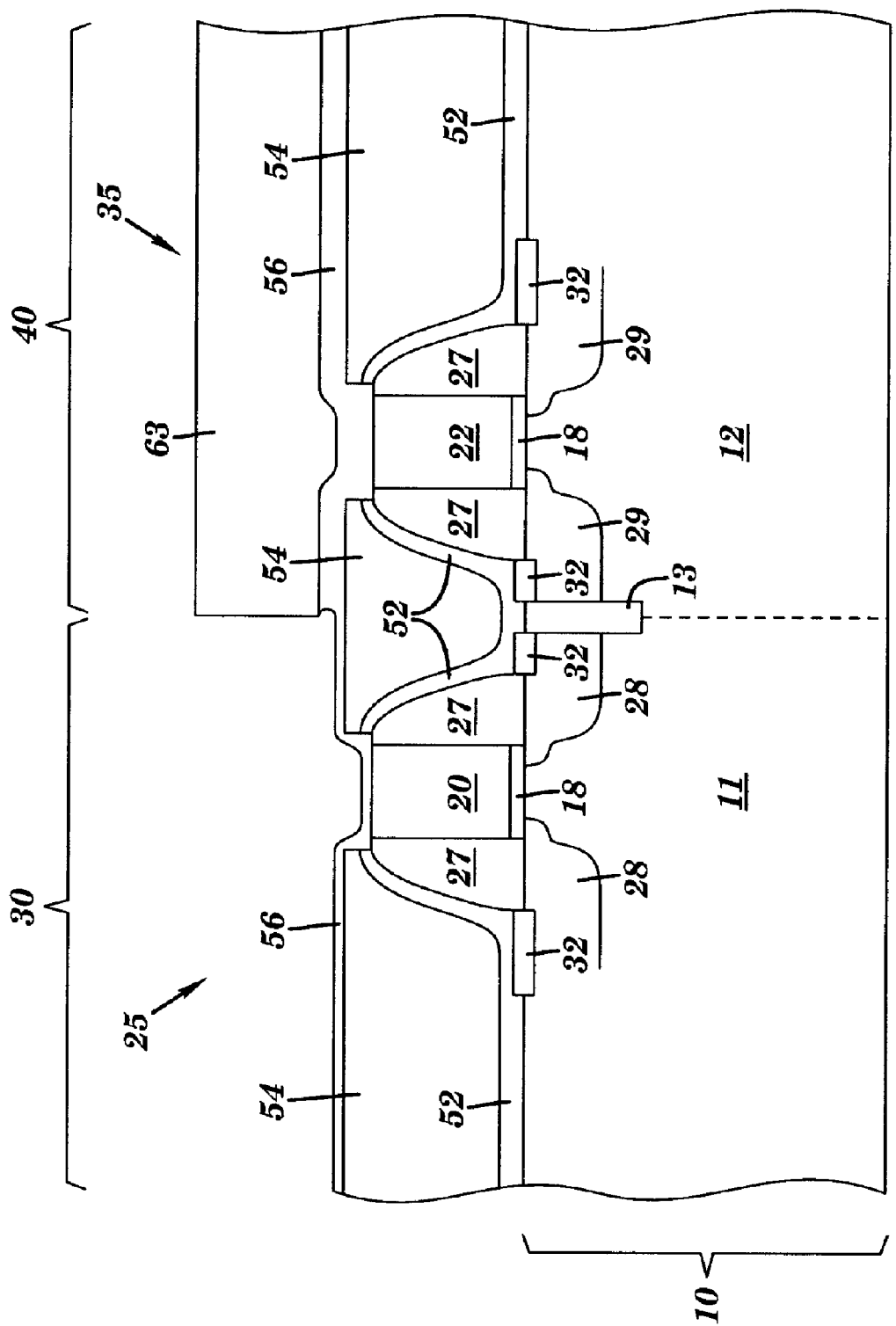

In another embodiment, a fully silicided nFET and partially-slicided pFET gates, is achieved using wet-etching instead of dry. Specifically referring to FIG. 11, immediately following the sequence of the embodiment described above starting at FIG. 7, a metal-containing layer 56, preferably containing Ni, is deposited at this point with thickness that is sufficient to fully-silicide the semiconductor (e.g. polysilicon) gates 20, 22. Next, the nFET area 40 is blocked with photo-resist layer 63 using an existing lithography reticle in the technology as shown in FIG. 12. Note that the present invention doesn't require the introduction of a new reticle into this step of the process. Next the metal-containing layer 56 is exposed to a dilute wet etch that removes metal from the p-FET areas, thinning it to a thickness such that the final resulting gate is not fully silicided following thermal reaction, as shown in FIG. 13. Note since wet etch processes are isotropic, lateral etching will occur. The photo-resist is then wet etched away, leaving the metal-containing layer 56 over the nFET region 40, but which has been thinned over the pFET region 30.

Figure 14:
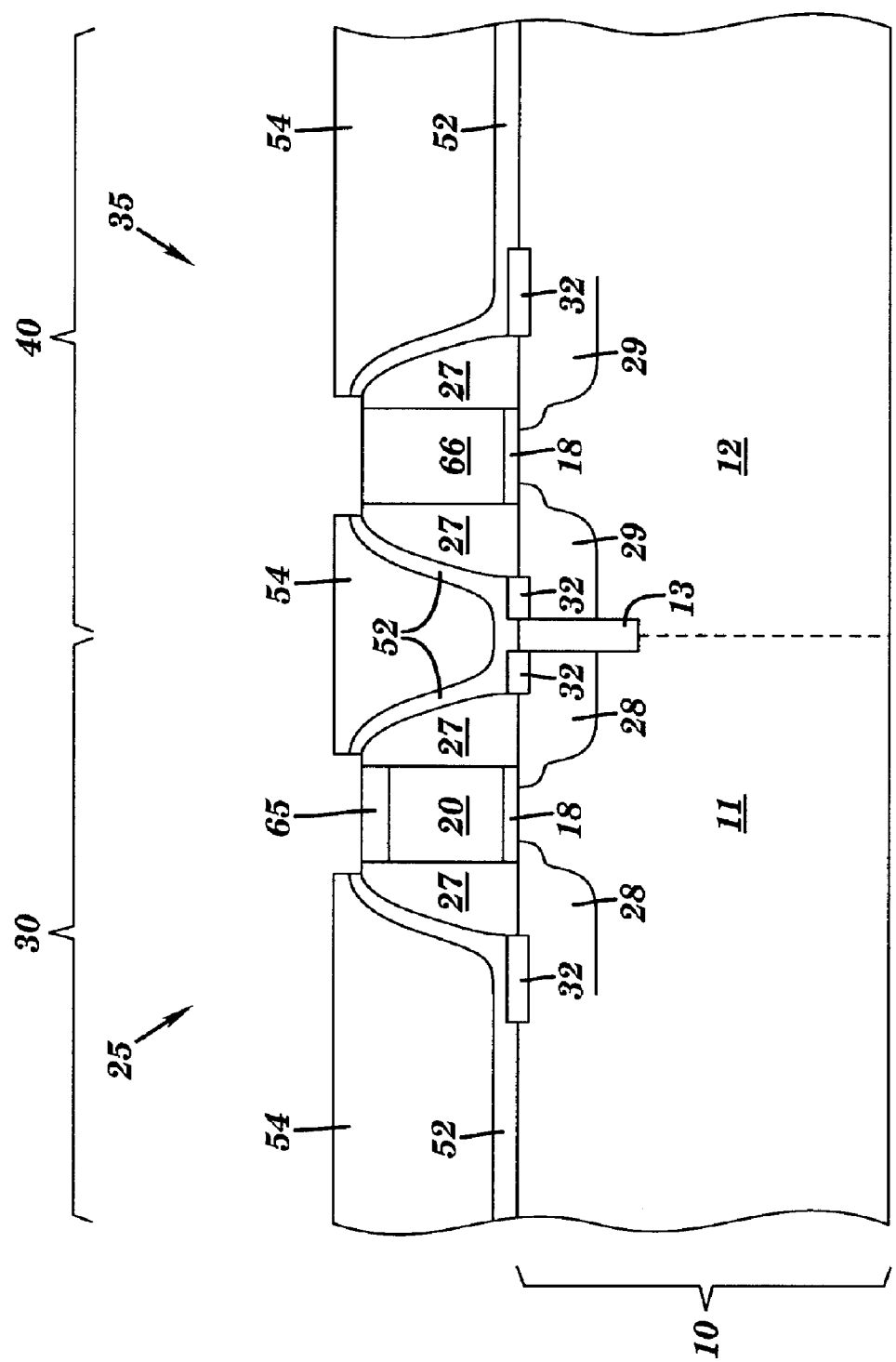

Referring to FIG. 14, the structure is subjected to a rapid thermal anneal (RTA) to react the metal layer 56 with the gate electrodes 20, 22. The temperature will depend on the reaction, for example, for a polysilicon gate electrode with Ni, the RTA is preferably performed in a temperature range 300–600° C. If the metal is Co, the preferred RTA temperature is in the range 550–750° C. Since the metal-containing layer 56 is thicker over the nFET areas 40 than over the pFET areas 30, the resulting nFET gate 35 is fully silicided having metal converted area 66, but the pFET gate 25 is partially silicided having a metal converted area 65 formed over polysilicon 20 conductor.

Figure 15:
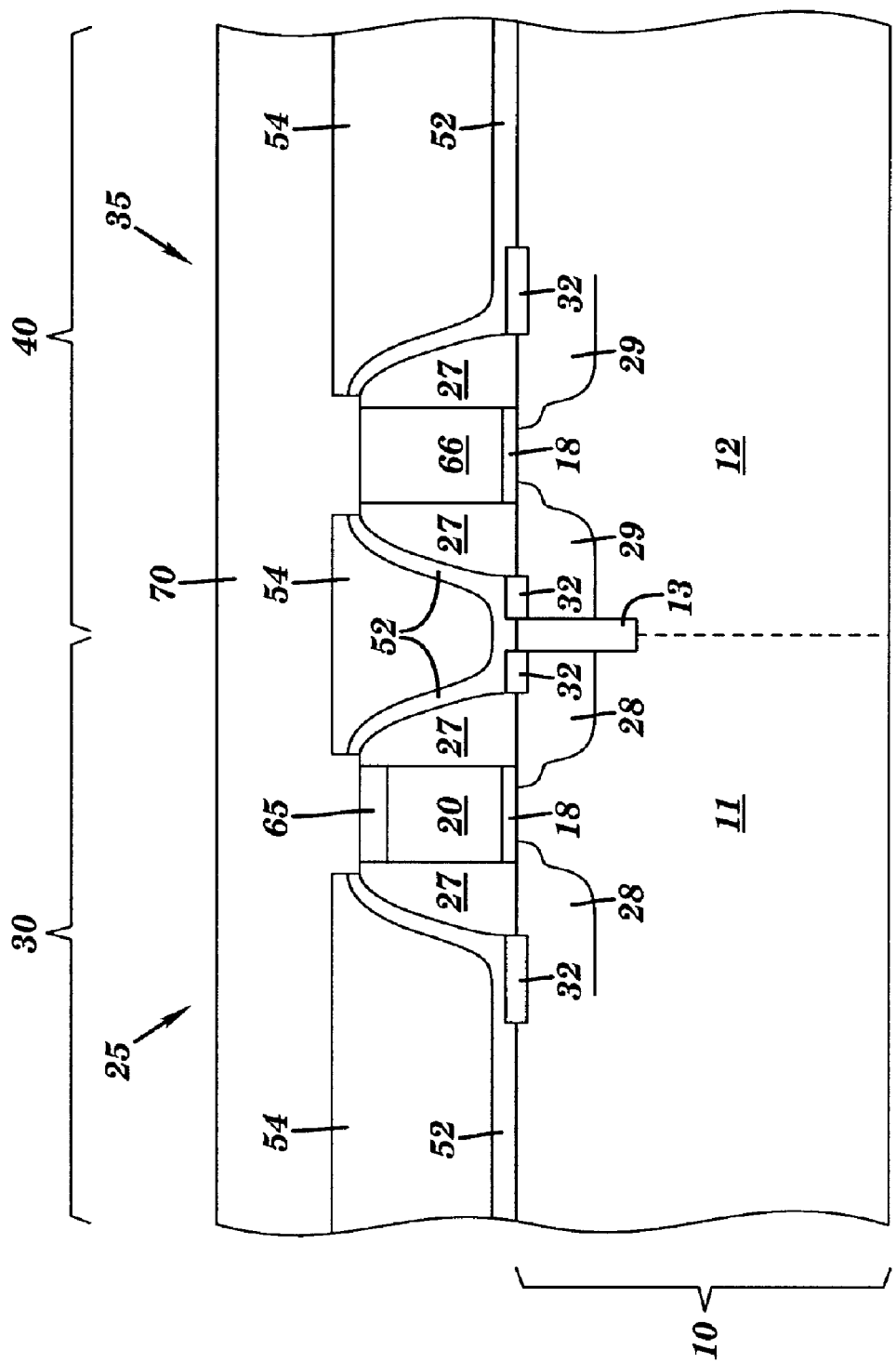

Finally, an interlevel dielectric (ILD) layer 70 is typically formed over the structure, typically having a thickness ranging from about 400 to 500 nm, as illustrated in FIG. 15. Subsequently, the nFET 35 and pFET 25 devices may be completed as normal.

In accordance with the invention, the method is not limited to full silicidation of the nFET and partial silicidation of the pFET, but is also applicable to forming a fully silicided pFET and a partially silicided nFET, with all appropriate changes being made.

The present invention enables a high performance CMOS structure that utilizes metal gate technology for one of an nFET and pFET, while also applying a conventional polysilicon gate electrode technology for the other one of an nFET and pFET. In the case of a fully silicided nFET and partially silicided pFET, the pFET performance can be further increased using many well-known techniques, such as using stress to improve performance, etc. The inventive structure and method is particularly applicable to dense circuits with spacing between nFET and pFET devices of less than about 200 nm, consistent with 65 nm technology and beyond.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of forming a semiconductor structure comprising:
   providing a structure comprising a gate stack in a first type MOSFET region and a gate stack in a second type MOSFET region, where said gate stacks each comprise a semiconductor layer, and said structure further comprising a planarized dielectric layer formed over said gate stacks in said first type MOSFET and said second type MOSFET regions;
   removing portions of said planarized dielectric layer to expose said semiconductor layers of said gate stacks;
   forming a metal-containing layer in contact with said exposed semiconductor layers of said gate stacks, wherein said metal-containing layer is thick enough to fully convert said semiconductor layer of said gate stack to a semiconductor metal alloy in said first type of said MOSFET region but not thick enough to fully convert said semiconductor layer to a semiconductor metal alloy in said second type of said MOSFET region; and
   forming a fully converted semiconductor metal alloy gate conductor from said metal-containing layer in contact with said semiconductor layer of said gate stack in said first type of said MOSFET region while forming a partially converted semiconductor metal alloy gate conductor from said metal-containing layer in contact with said semiconductor layer of said gate stack in said second type of said MOSFET region.

2. The method of claim 1 wherein said semiconductor layers of said gate stacks comprise silicon and said metal-containing layer comprises a metal capable of forming a semiconductor metal silicide when in contact with silicon and has a work-function that is substantially similar to the work-function of heavily doped polysilicon.

3. The method of claim 1 further comprising, prior to forming said metal-containing layer, recessing said semiconductor layer of said gate stack in said first type of said MOSFET region to a height that is less than the height of said semiconductor layer of said gate stack in said second type of said MOSFET region.

4. The method of claim 3 wherein said recessing said semiconductor layer of said gate stack in said first type of said MOSFET region comprises an anisotropic etch of said semiconductor layer of said gate stack in said first type MOSFET region selective to said planarized dielectric layer.

5. The method of claim 3 wherein said metal-containing layer comprises nickel and said forming said fully and partially converted semiconductor metal alloy layers of said gate stacks comprises a rapid thermal anneal at a temperature between about 300–600° C.

6. The method of claim 3 wherein said semiconductor layers of said gate stacks comprise a semiconductor selected from the group consisting of Si, Ge, SiGe, SiC, SiGeC and GaAs.

7. The method of claim 1 wherein said forming said metal-containing layer further comprises thinning said metal-containing layer over said second type of MOSFET region relative to the thickness of said metal-containing layer over said first type MOSFET region.

8. The method of claim 7 wherein said thinning said metal-containing layer over said second type MOSFET region further comprises forming a masking layer over said first type MOSFET region and thinning said metal-containing layer over said second type MOSFET region using a wet etch.

9. The method of claim 8 wherein said wet etch comprises a dilute wet etch.

10. The method of claim 7 wherein said metal-containing layer comprises nickel and said forming said fully and partially converted semiconductor metal alloy gates comprises a rapid thermal anneal at a temperature between about 300–600° C.

11. The method of claim 7 wherein said semiconductor layers of said gate stacks comprise a semiconductor selected from the group consisting of Si, Ge, SiGe, SiC, SiGeC and GaAs.

12. The method of claim 1 wherein said metal-containing layer comprises nickel and said forming said fully and partially converted semiconductor metal alloy gates comprises a rapid thermal anneal at a temperature between about 300–600° C.

13. The method of claim 1 wherein said semiconductor layers of said gate stacks comprise a semiconductor selected from the group consisting of Si, Ge, SiGe, SiC, SiGeC and GaAs.

14. The method of claim 1 wherein said first type MOSFET region is an nFET region and said second type MOSFET region is a pFET region.

* * * * *